(12) United States Patent
Kim et al.

(10) Patent No.: US 12,396,150 B2
(45) Date of Patent: Aug. 19, 2025

(54) PATTERN FORMATION METHOD AND SEMICONDUCTOR DEVICE FABRICATION METHOD USING THE SAME

(71) Applicant: SAMSUNG ELECTRONICS CO., LTD., Suwon-si (KR)

(72) Inventors: Dohee Kim, Seoul (KR); Sunguk Jang, Hwaseong-si (KR); Sahwan Hong, Suwon-si (KR); Kongsoo Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 507 days.

(21) Appl. No.: 17/858,150

(22) Filed: Jul. 6, 2022

(65) Prior Publication Data
US 2023/0137340 A1    May 4, 2023

(30) Foreign Application Priority Data
Oct. 29, 2021 (KR) .................. 10-2021-0146700

(51) Int. Cl.
H10B 12/00    (2023.01)

(52) U.S. Cl.
CPC ........... *H10B 12/05* (2023.02); *H10B 12/482* (2023.02); *H10B 12/488* (2023.02)

(58) Field of Classification Search
CPC ..... H10B 12/05; H10B 12/482; H10B 12/488
See application file for complete search history.

(56) References Cited

U.S. PATENT DOCUMENTS

| | | | |
|---|---|---|---|
| 7,022,567 B2* | 4/2006 | Huh | H01L 21/76897 257/E21.507 |
| 7,879,679 B2 | 2/2011 | Kermarrec et al. | |
| 8,129,787 B2 | 3/2012 | Brindle et al. | |
| 8,575,683 B1* | 11/2013 | Shih | H10B 41/30 257/306 |
| 8,765,563 B2 | 7/2014 | Pillarisetty et al. | |
| 9,123,567 B2 | 9/2015 | Radosavljevic et al. | |
| 9,425,291 B1* | 8/2016 | Balakrishnan | H10D 84/83 |
| 9,460,931 B2* | 10/2016 | Pachamuthu | H10D 64/035 |
| 9,461,063 B1* | 10/2016 | Lai | H10B 43/27 |
| 9,818,872 B2 | 11/2017 | Ching et al. | |
| 10,038,053 B2* | 7/2018 | Balakrishnan | H10D 62/121 |
| 10,056,454 B2 | 8/2018 | Kim et al. | |
| 10,084,043 B2 | 9/2018 | Dewey et al. | |

(Continued)

FOREIGN PATENT DOCUMENTS

| | | | | |
|---|---|---|---|---|
| CN | 106298472 A | * | 1/2017 | ............. H01L 21/20 |
| CN | 107492554 A | * | 12/2017 | ....... H01L 21/76877 |

(Continued)

*Primary Examiner* — Laura M Menz
(74) *Attorney, Agent, or Firm* — Muir Patent Law, PLLC

(57) ABSTRACT

A pattern formation method includes forming a first capping layer on a substrate, forming a recess that penetrates the first capping layer and an upper portion of the substrate, such that a non-penetrated portion of the first capping layer constitutes a first capping pattern, forming a second capping pattern that covers an inner sidewall of the recess, and forming a stack structure in the recess, such that the stack structure includes first stack patterns and second stack patterns that are alternately stacked, and the second capping pattern is between the substrate and a lateral surface of the stack structure.

19 Claims, 16 Drawing Sheets

(56) References Cited

U.S. PATENT DOCUMENTS

| | | | |
|---|---|---|---|
| 10,141,200 B2* | 11/2018 | Byun | H01L 21/764 |
| 11,031,298 B2* | 6/2021 | Liao | H01L 21/3065 |
| 11,038,036 B2 | 6/2021 | Lee et al. | |
| 11,139,368 B2* | 10/2021 | Chern | H10D 1/714 |
| 12,185,528 B2* | 12/2024 | Kim | H10B 12/34 |
| 2005/0090086 A1* | 4/2005 | Huh | H01L 21/76897 |
| | | | 257/E21.507 |
| 2008/0239625 A1* | 10/2008 | Kermarrec | H10D 8/045 |
| | | | 361/306.3 |
| 2015/0076584 A1* | 3/2015 | Pachamuthu | H10B 43/35 |
| | | | 257/315 |
| 2016/0104788 A1* | 4/2016 | Ryu | H01L 21/31053 |
| | | | 438/586 |
| 2017/0358590 A1* | 12/2017 | Kang | H10B 41/35 |
| 2018/0012775 A1* | 1/2018 | Byun | H01L 21/4885 |
| 2018/0226423 A1* | 8/2018 | Kang | H10B 43/35 |
| 2018/0315665 A1* | 11/2018 | Mosden | H10D 84/038 |
| 2019/0004416 A1* | 1/2019 | Wang | H01L 21/0276 |
| 2019/0164776 A1* | 5/2019 | Choi | H10D 30/62 |
| 2020/0168715 A1* | 5/2020 | Wu | H01L 21/30604 |
| 2020/0176326 A1* | 6/2020 | Liao | H01L 21/30625 |
| 2021/0098566 A1* | 4/2021 | Chern | H10D 1/042 |
| 2022/0020844 A1* | 1/2022 | Chern | H10D 1/665 |
| 2022/0216113 A1* | 7/2022 | Lin | H10D 30/0227 |
| 2022/0262790 A1* | 8/2022 | Kim | H10D 64/017 |
| 2022/0278226 A1* | 9/2022 | Hall | H10D 30/6757 |
| 2022/0415887 A1* | 12/2022 | Kim | H10D 84/0158 |
| 2023/0066367 A1* | 3/2023 | Park | G11C 5/06 |
| 2023/0075966 A1* | 3/2023 | Xie | H10D 62/118 |
| 2023/0137340 A1* | 5/2023 | Kim | H10B 12/488 |
| | | | 438/253 |
| 2023/0255015 A1* | 8/2023 | Shin | H10B 12/05 |
| | | | 257/296 |
| 2023/0345699 A1* | 10/2023 | Li | H10D 1/714 |
| 2024/0147709 A1* | 5/2024 | Kim | H10B 12/50 |
| 2024/0222123 A1* | 7/2024 | Kim | H01L 21/0332 |

FOREIGN PATENT DOCUMENTS

| | | | | | |
|---|---|---|---|---|---|
| CN | 106298472 B | * | 1/2019 | | H01L 21/20 |
| CN | 109817635 A | * | 5/2019 | | |
| CN | 109860196 A | * | 6/2019 | | |
| CN | 109887924 A | * | 6/2019 | | |
| CN | 116096073 A | * | 5/2023 | | H01L 27/10873 |
| DE | 102019119044 A1 | * | 6/2020 | | B82Y 10/00 |
| EP | 1041639 A1 | * | 10/2000 | | B82Y 10/00 |
| EP | 4243078 A1 | * | 9/2023 | | H01L 27/1203 |
| TW | 201640652 A | * | 11/2016 | | |
| WO | WO-2007132425 A1 | * | 11/2007 | | B82Y 20/00 |
| WO | WO-2021262249 A1 | * | 12/2021 | | H01L 21/02546 |
| WO | WO-2023060794 A1 | * | 4/2023 | | H10B 12/03 |
| WO | WO-2023084283 A1 | * | 5/2023 | | C30B 23/02 |

* cited by examiner

PATTERN FORMATION METHOD AND SEMICONDUCTOR DEVICE FABRICATION METHOD USING THE SAME

CROSS-REFERENCE TO RELATED APPLICATION

This U.S. nonprovisional application claims priority under 35 U.S.C. § 119 to Korean Patent Application No. 10-2021-0146700, filed on Oct. 29, 2021, in the Korean Intellectual Property Office, the disclosure of which is hereby incorporated by reference in its entirety.

BACKGROUND

1. Field

Example embodiments relate to a pattern formation method and a semiconductor device fabrication method using the same.

2. Description of the Related Art

Semiconductor devices are beneficial in the electronic industry because of their small size, multi-functionality, and/or low fabrication cost. Semiconductor devices may be categorized as any one of semiconductor memory devices storing logic data, semiconductor logic devices processing operations of logic data, and hybrid semiconductor devices having both memory and logic elements.

With the recent high advancement of electronic industry, there is an increasing demand for semiconductor devices. To meet this demand, many studies are being conducted on improvement in productivity and yield of semiconductor devices.

SUMMARY

According to some embodiments, a pattern formation method may include forming a first capping layer on a substrate; forming a recess that penetrates the first capping layer and an upper portion of the substrate, a non-penetrated portion of the first capping layer constituting a first capping pattern; forming a second capping pattern that covers an inner sidewall of the recess; and forming a stack structure in the recess. The stack structure may include a plurality of first stack patterns and a plurality of second stack patterns that are alternately stacked. The second capping pattern may be between the substrate and a lateral surface of the stack structure.

According to some embodiments, a semiconductor device fabrication method may include forming a first capping layer on a substrate; forming a recess that penetrates the first capping layer and an upper portion of the substrate, a non-penetrated portion of the first capping layer constituting a first capping pattern; forming a second capping pattern that covers an inner sidewall of the recess; forming a stack structure including a plurality of first stack patterns and a plurality of second stack patterns that are alternately stacked in the recess; forming a protrusion of the substrate by removing the first capping pattern, the second capping pattern, and a portion of the substrate; removing the second stack patterns; forming a semiconductor pattern by removing a portion of each of the first stack patterns; forming on the semiconductor pattern a word line that run across the semiconductor pattern; forming a bit line connected to one end of the semiconductor pattern, the bit line intersecting the word line; and forming a capacitor connected to another end of the semiconductor pattern.

According to some embodiments, a semiconductor device fabrication method may include forming a first capping layer on a substrate; forming a recess that penetrates the first capping layer and an upper portion of the substrate, a non-penetrated portion of the first capping layer constituting a first capping pattern; forming a second capping pattern that covers an inner sidewall of the recess; forming a stack structure including a plurality of first stack patterns and a plurality of second stack patterns that are alternately stacked along a first direction perpendicular to a top surface of the substrate, the stack structure including a first part and a second part that are alternately provided along a second direction parallel to the top surface of the substrate; forming a protrusion of the substrate by removing the first capping pattern, the second capping pattern, and a portion of the substrate; removing the second part of the stack structure; removing the second stack patterns of the first part of the stack structure; and forming a gate structure in a region where the second stack patterns are removed.

BRIEF DESCRIPTION OF THE DRAWINGS

Features will become apparent to those of skill in the art by describing in detail exemplary embodiments with reference to the attached drawings, in which.

DETAILED DESCRIPTION

FIGS. 1 to 6 illustrate cross-sectional views of stages in a pattern formation method according to some embodiments.

Figure 1:
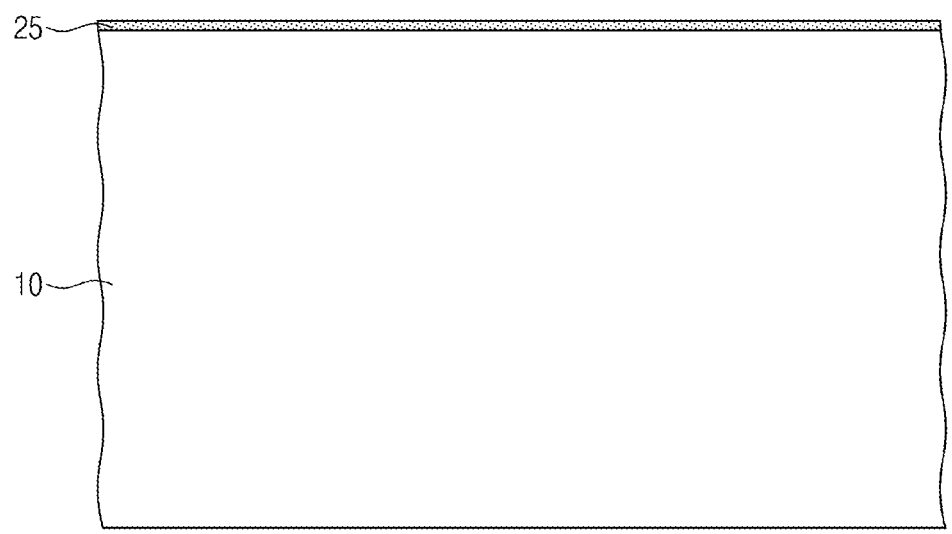
FIGS. 1 to 6 illustrate cross-sectional views of stages in a pattern formation method according to some embodiments.
Figure 1:
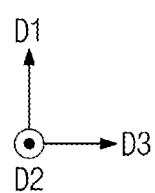

Referring to FIG. 1, a first capping layer 25 may be formed on a substrate 10. The substrate 10 may be a semiconductor substrate. For example, the substrate 10 may be a silicon substrate or a silicon-on-insulator (SOI) substrate. The substrate 10 may include silicon.

The first capping layer 25 may be formed to cover a top surface of the substrate 10. The first capping layer 25 may include a material having a high etch selectivity with respect to the substrate 10. For example, the substrate 10 may be a silicon substrate, and the first capping layer 25 may include a material having a high etch selectivity with respect to the silicon substrate, e.g., silicon oxide.

Figure 2:
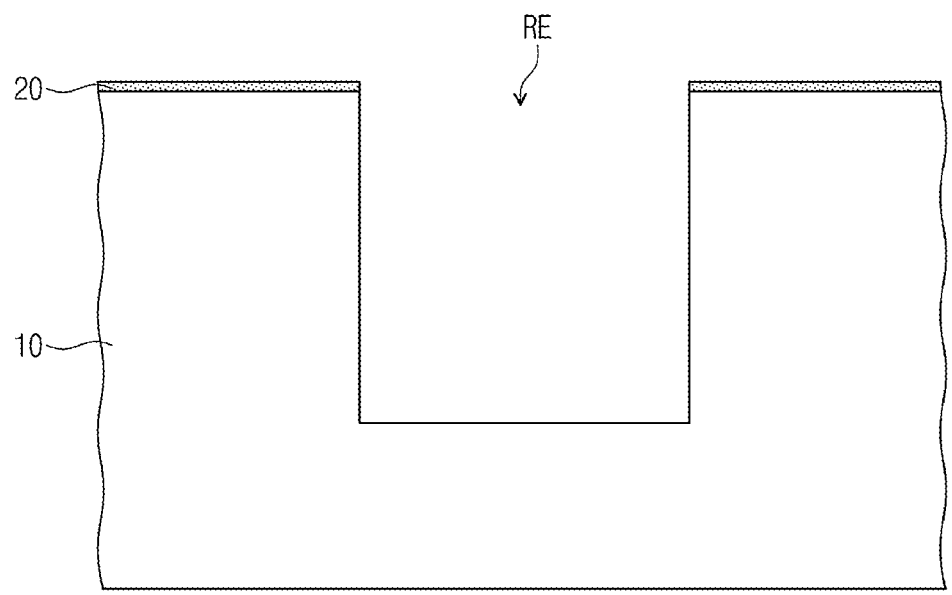
Figure 2:
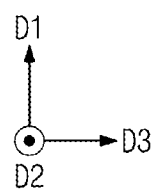

Referring to FIG. 2, a recess RE may be formed to penetrate the first capping layer 25 and an upper portion of the substrate 10. The recess RE may extend along a first direction D1 perpendicular to the top surface of the substrate 10 from a top surface of the first capping layer 25 toward a bottom surface of the substrate 10. The recess RE may further extend along a second direction D2 parallel to the top surface of the substrate 10 or along a third direction D3 that is parallel to the top surface of the substrate 10 and intersects (or is orthogonal to) the second direction D2. For example, when viewed in plan, the recess RE may have a linear shape that extends along the second direction D2. Alternatively, the recess RE may be a hole having, at its top end, a circular shape when viewed in plan.

A photolithography process and an etching process may be sequentially performed to form the recess RE. For example, a photoresist layer (not shown) may be formed on the first capping layer 25, and the photoresist layer may undergo a photolithography process (e.g., exposure and development processes) to form a photoresist pattern (not shown). The photoresist pattern may define an area where the recess RE will be formed. Afterwards, an etching process may be performed in which the photoresist pattern is used as an etching mask. The etching process may remove a portion of the first capping layer 25 and an upper portion of the substrate 10, thereby forming the recess RE. The etching process may include, e.g., an anisotropic etching process. The first capping layer 25 may be etched through the etching process to form a first capping pattern 20, i.e., the first capping pattern 20 may be constituted by a remaining portion of the first capping layer 25 that is not removed by the etching process. During the etching process, the first capping pattern 20 may be used as an etching mask to remove the upper portion of the substrate 10. For example, the first capping pattern 20 may include silicon oxide.

Figure 3:
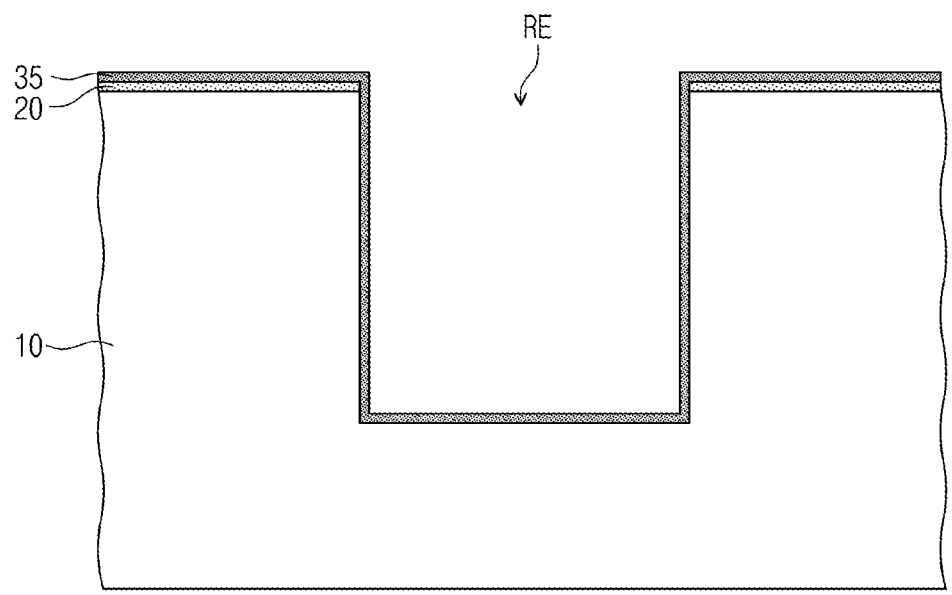
Figure 3:
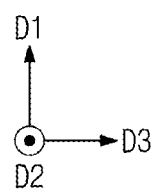

Referring to FIG. 3, a second capping layer 35 may be formed on the substrate 10. For example, the second capping layer 35 may cover an inner sidewall and a bottom surface of the recess RE and may extend onto a top surface of the first capping pattern 20. The second capping layer 35 may be formed to conformally cover (or may be formed to have a uniform thickness that covers) the inner sidewall of the recess RE, the bottom surface of the recess RE, and the top surface of the first capping pattern 20. The second capping layer 35 may be formed to cover a surface of the substrate 10 exposed by the recess RE.

The second capping layer 35 may include a material having a high etch selectivity with respect to the first capping pattern 20. For example, the first capping pattern 20 may include silicon oxide, and the second capping layer 35 may include a material having a high etch selectivity with respect to the silicon oxide, e.g., silicon nitride.

Figure 4:
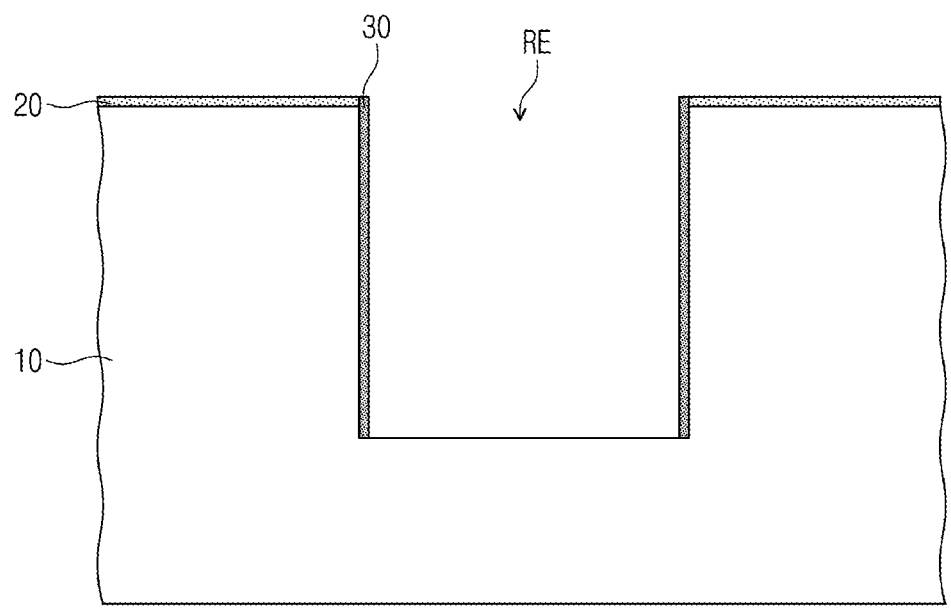
Figure 4:
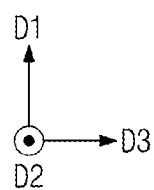

Referring to FIG. 4, the second capping layer 35 may be partially etched to form a second capping pattern 30. The second capping layer 35 may undergo an anisotropic etching process to form the second capping pattern 30.

The second capping pattern 30 may be formed to cover the inner sidewall of the recess RE. For example, the anisotropic etching process may remove the second capping layer 35 that covers the bottom surface of the recess RE and the top surface of the first capping pattern 20, and the second capping layer 35 that covers the inner sidewall of the recess RE may not be removed to constitute the second capping pattern 30.

As the second capping layer 35 is removed from the bottom surface of the recess RE, a portion of the surface of the substrate 10 may be partially exposed on the bottom surface of the recess RE. The second capping pattern 30 may be disposed on the inner sidewall of the recess RE to cover another portion of the surface of the substrate 10.

Figure 5:
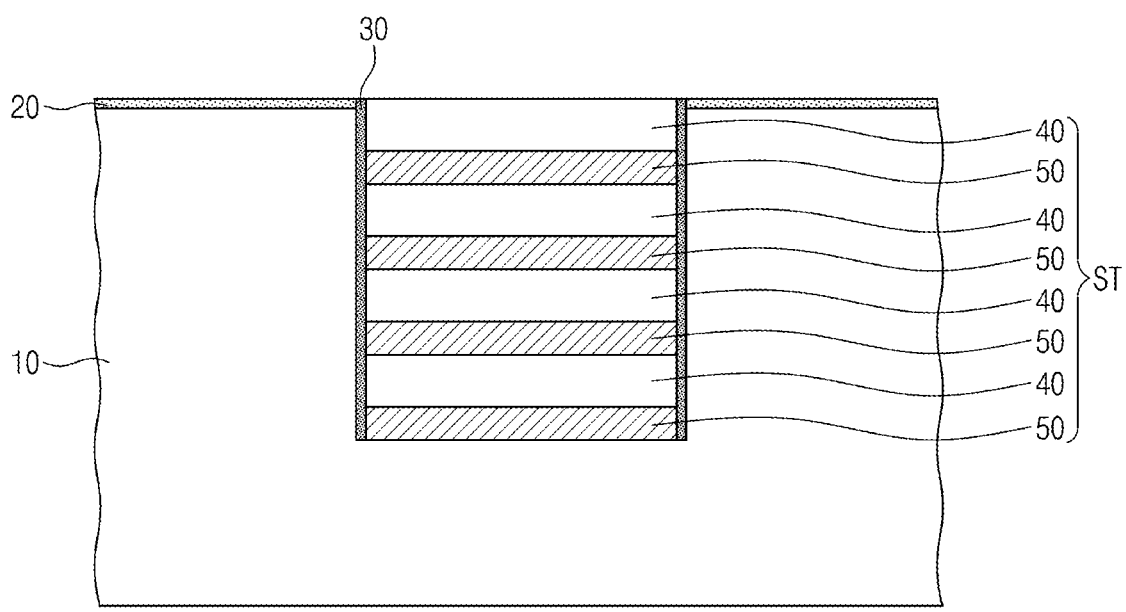
Figure 5:
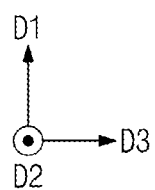

Referring to FIG. 5, a stack structure ST may be formed in the recess RE. The stack structure ST may include first stack patterns 40 and second stack patterns 50 that are alternately stacked.

The formation of the stack structure ST may include alternately epitaxially growing the first stack patterns 40 and the second stack patterns 50. For example, the substrate 10 may have a surface exposed on the bottom surface of the recess RE, and the second stack pattern 50 may be, e.g., directly, epitaxially grown from a seed or the exposed surface of the substrate 10. Afterwards, the first stack pattern 40 may be epitaxially grown from a seed or a surface of the second stack pattern 50. A new second stack pattern 50 may be epitaxially grown from the first stack pattern 40 that serves as a seed, and these procedures may be repeatedly performed to form the stack structure ST in which the first stack patterns 40 and the second stack patterns 50 are alternately stacked. Alternatively, the first stack pattern 40 may be, e.g., directly, epitaxially grown from a seed or the exposed surface of the substrate 10, and the second stack pattern 50 and a new first stack pattern 40 may be repeatedly grown on the first stack pattern 40.

A rate of epitaxial growth from a surface of the first capping pattern 20 or the second capping pattern 30 may be less than that from the exposed surface of the substrate 10. Therefore, no epitaxial growth may be performed from the surface of the first capping pattern 20 or the second capping pattern 30.

The second capping pattern 30 may be interposed between the substrate 10 and a lateral surface of the stack structure ST, e.g., the second capping pattern 30 may be interposed between an inner sidewall of the recess RE and the lateral surface of the stack structure ST. For example, the second capping pattern 30 may be interposed between the substrate 10 and lateral surfaces of the first stack patterns 40 and between the substrate 10 and lateral surfaces of the second stack patterns 50.

The first and second stack patterns 40 and 50 may include a same material as at least one material of the substrate 10. For example, the substrate 10 may be a silicon substrate, and the first and second stack patterns 40 and 50 may include silicon (Si). The second stack patterns 50 may further include germanium (Ge). For example, each of the second stack patterns 50 may include silicon and germanium, and may have a superlattice structure.

Figure 6:
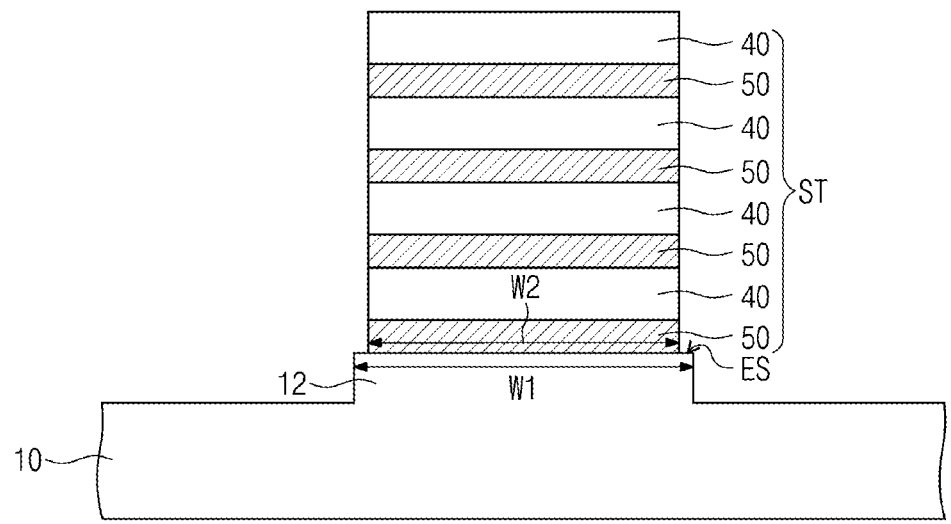
Figure 6:
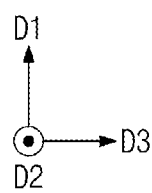

Referring to FIG. 6, the first capping pattern 20, the second capping pattern 30, and a portion of the substrate 10 may be removed. Accordingly, the lateral surfaces of the stack structure may be exposed.

In detail, the first capping pattern 20 and a portion of the substrate 10 below the first capping pattern 20 may be removed on opposite lateral surfaces of the stack structure ST. Therefore, the second capping pattern 30 may be exposed on the opposite lateral surfaces of the stack structure ST. Afterwards, the second capping pattern 30 may be removed from the opposite lateral surfaces of the stack structure ST. Thus, the opposite lateral surfaces of the stack structure ST may be exposed. For example, the removal procedure mentioned above may expose the lateral surfaces of the first stack patterns 40 and the lateral surfaces of the second stack patterns 50.

The partial removal of the substrate 10 may form a protrusion 12 of the substrate 10, e.g., the protrusion 12 may extend above other portions of a top surface of the substrate 10. The protrusion 12 may be a portion of the substrate 10 present below the stack structure ST and the second capping pattern 30, e.g., the protrusion 12 may be directly under and vertically overlapped by the stack structure ST and the second capping pattern 30. The protrusion 12 may have a top surface at a higher level than other portions of the top surface of the substrate 10 relative to a bottom surface of the substrate 10. The protrusion 12 may have at its upper portion a width W1 greater than a width W2 at a lower portion of the stack structure ST, e.g., along the third direction D3.

The protrusion 12 may have, at its top surface, an exposed surface ES exposed by the stack structure ST. For example, as illustrated in FIG. 6, the protrusion 12 may extend horizontally, e.g., along the third direction D3, beyond the stack structure ST (e.g., due to a space defined by the removed capping pattern 30), so a top surface of the protrusion 12 extending beyond the stack structure ST may define the exposed surface ES. A stepwise profile may be constituted by the lateral surface of the stack structure ST, the exposed surface ES of the protrusion 12, and a lateral surface of the protrusion 12, e.g., a combined profile of the lateral surface of the stack structure ST, the exposed surface ES of the protrusion 12, and a lateral surface of the protrusion 12 together may have a stepwise profile (e.g., have a stair-shape cross section). The exposed surface ES may be a surface of the substrate 10 below the second capping pattern 30.

According to example embodiments, before forming the stack structure ST of the first stack patterns 40 and the second stack patterns 50 on the substrate 10, the recess RE may be formed by removing an upper portion of the substrate 10 from an area to accommodate the stack structure ST. After that, the stack structure ST may be epitaxially grown in the recess RE, with the growth of the stack structure ST being limited due to the first capping pattern 20 that covers the substrate 10 except the area where the recess RE is formed. For example, the stack structure ST may be formed only on a specific area of the substrate 10, e.g., only in the specific area including the recess RE. Therefore, because no epitaxial growth is required on a remaining area of the substrate 10, there may be a reduction in time consumption required for the epitaxial growth process, and accordingly, there may be an increase in productivity by using a pattern formation method according to embodiments.

Moreover, as the second capping pattern 30 covers the inner sidewall of the recess RE, there may be a limitation imposed on the epitaxial growth from a surface of the substrate 10 exposed on the inner sidewall of the recess RE. Therefore, the epitaxial growth may be performed only on a surface of the substrate 10 exposed on the bottom surface of the recess RE, and as a result, the stack structure ST may increase in crystallinity.

FIGS. 7 to 11 illustrate cross-sectional views showing a semiconductor device fabrication method using the pattern formation method of FIGS. 1 to 6. With reference to FIGS. 7 to 11, the following will describe a semiconductor device fabrication method using the pattern formation method discussed with reference to FIGS. 1 to 6. A duplicate explanation will be omitted for brevity of description.

Figure 7:
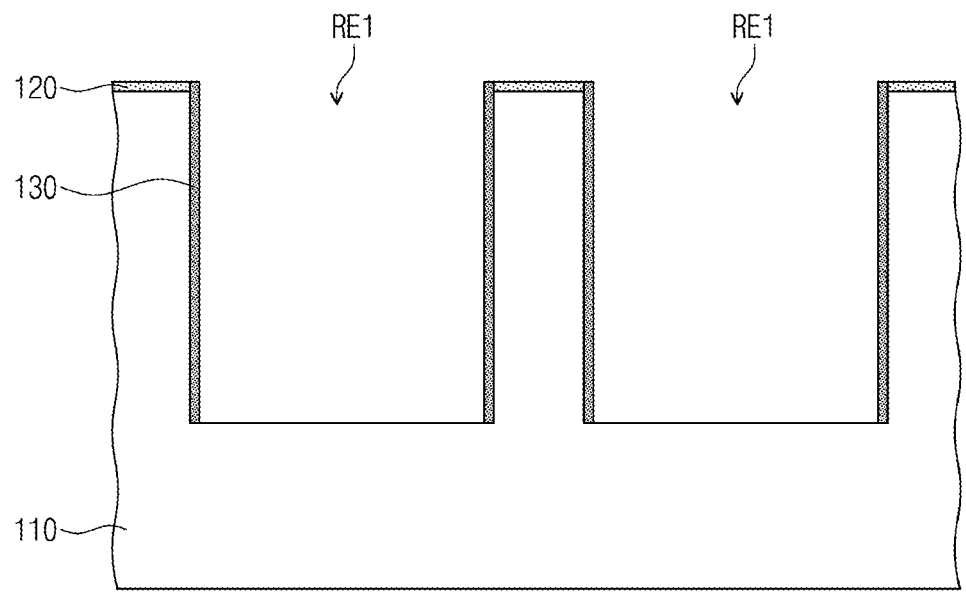
FIGS. 7 to 11 illustrate cross-sectional views of stages in a semiconductor device fabrication method using the pattern formation method of FIGS. 1 to 6.
Figure 7:
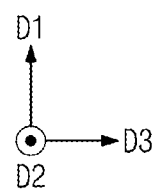

Referring to FIG. 7, a first capping pattern 120 and first recesses RE1 may be formed on a substrate 110. The formation of the first capping pattern 120 and the first recesses RE1 may include forming a first capping layer on the substrate 110, and removing a portion of the first capping layer and an upper portion of the substrate 110 to form the first recesses RE1 that penetrate the first capping layer and the upper portion of the substrate 110. A non-removed portion of the first capping layer may constitute the first capping pattern 120. The first recesses RE1 may penetrate the upper portion of the substrate 110 along the first direction D1 perpendicular to a top surface of the substrate 110, and when viewed in plan, may each have a linear shape that extends along the second direction D2 parallel to the top surface of the substrate 110.

The first capping pattern 120 may include a material having a high etch selectivity with respect to the substrate 110. For example, the substrate 110 may be a silicon substrate, and the first capping pattern 120 may include a material having a high etch selectivity with respect to the silicon substrate, e.g., silicon oxide.

A second capping pattern 130 may be formed to cover inner sidewalls of the first recesses RE1. For example, a second capping layer may be formed to cover an inner sidewall and a bottom surface of each of the first recesses RE1 and to extend onto a top surface of the first capping pattern 120. The second capping layer may be formed to conformally cover the inner sidewall of the first recess RE1, the bottom surface of the first recess RE1, and the top surface of the first capping pattern 120.

Afterwards, the second capping layer may be removed from the top surface of the first capping pattern 120 and from the bottom surface of the first recess RE1. A non-removed portion of the second capping layer may remain on the inner sidewall of the first recess RE1, and may constitute the second capping pattern 130. As the second capping layer is removed from the bottom surface of the first recess RE1, a surface of the substrate 110 may be partially exposed on the bottom surface of the first recess RE1.

The second capping pattern 130 may include a material having a high etch selectivity with respect to the first capping pattern 120. For example, the first capping pattern 120 may include silicon oxide, and the second capping pattern 130 may include a material having a high etch selectivity with respect to the silicon oxide, e.g., silicon nitride.

Figure 8:
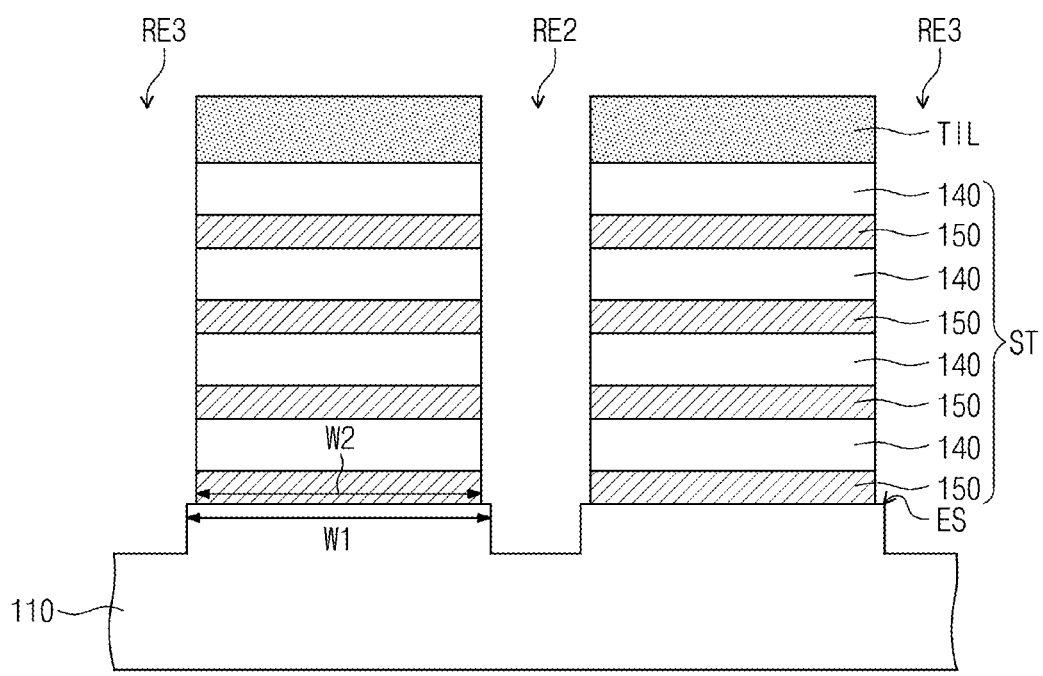
Figure 8:
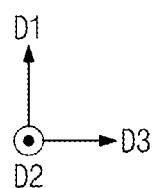

Referring to FIG. 8, the stack structure ST may be formed in each of the first recesses RE1, e.g., in a same manner discussed previously with reference to FIGS. 5-6. The stack structure ST may include first stack patterns 140 and second stack patterns 150 that are alternately stacked.

The formation of the stack structure ST may include alternately epitaxially growing the first stack patterns 140 and the second stack patterns 150. For example, the second stack pattern 150 may be epitaxially grown from a seed or a surface of the substrate 110 exposed on the bottom surface of the first recess RE1, and the first stack pattern 140 may be epitaxially grown from the second stack pattern 150 that serves as a seed. Afterwards, an epitaxial growth of a new second stack pattern 150 and a new first stack pattern 140 may be repeatedly performed.

An upper dielectric layer TIL may further be formed on the stack structure ST. The upper dielectric layer TIL may include, e.g., silicon oxide.

After the formation of the stack structure ST, the first capping pattern 120, the second capping pattern 130, and a portion of the substrate 110 may be removed. The partial removal of the substrate 110 may form a protrusion 112 of the substrate 110. The protrusion 112 may have at its upper portion a width W1 greater than a width W2 at a lower portion of the stack structure ST. The protrusion 112 may have, at its top surface, the exposed surface ES exposed by the stack structure ST. A stepwise profile may be constituted by a lateral surface of the stack structure ST, the exposed surface ES of the protrusion 112, and a lateral surface of the protrusion 112.

The removal procedure mentioned above may form a second recess RE2 between a certain stack structure ST and a neighboring stack structure ST on one side of the certain stack structure ST, and a third recess RE3 may be formed on another side of the certain stack structure ST. That is, as illustrated in FIG. 8, recesses may be formed between adjacent stack structures ST. The second and third recesses RE2 and RE3 may expose the lateral surface of the stack structure ST. For example, the second and third recesses RE2 and RE3 may expose lateral surfaces of the first stack patterns 140 of the stack structure ST, and may also expose lateral surfaces of the second stack patterns 150 of the stack structure ST.

Figure 9:
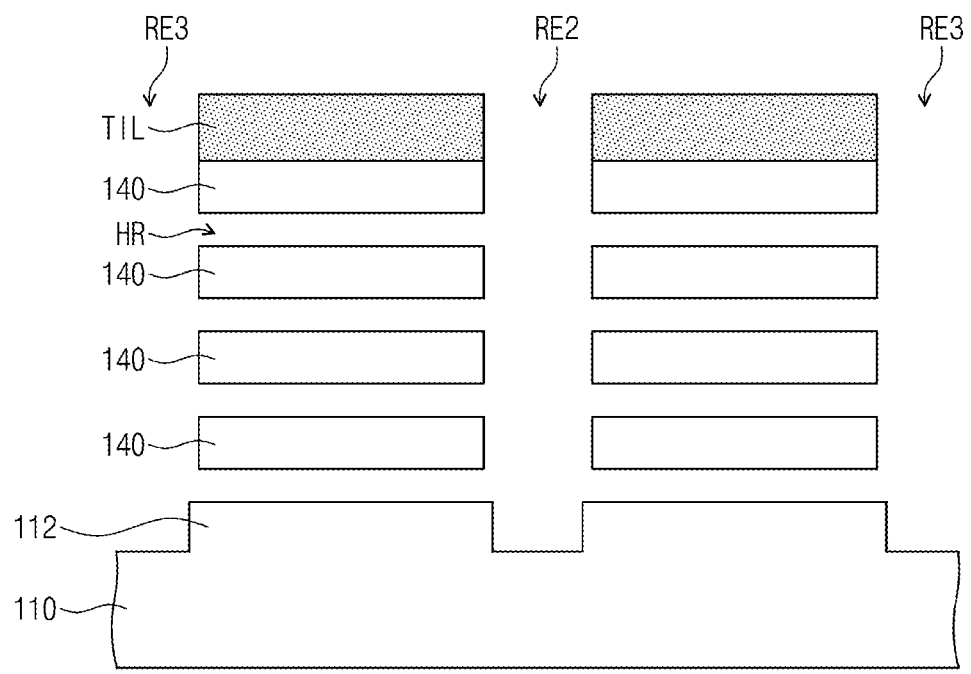

Referring to FIG. 9, the second stack patterns 150 exposed to the second and third recesses RE2 and RE3 may be removed to form first horizontal regions HR. The formation of the first horizontal regions HR may include etching the second stack patterns 150 by performing an isotropic etching process that has a high etch selectivity with respect to the substrate 110 and the first stack patterns 140. The first horizontal regions HR may be interposed between the first stack patterns 140 that neighbor each other in a direction perpendicular to the substrate 110, e.g., along the first direction D1. Although not shown, the first stack patterns 140 may be supported by isolation dielectric patterns, and may thus be spaced apart from each other without collapsing.

Figure 10:
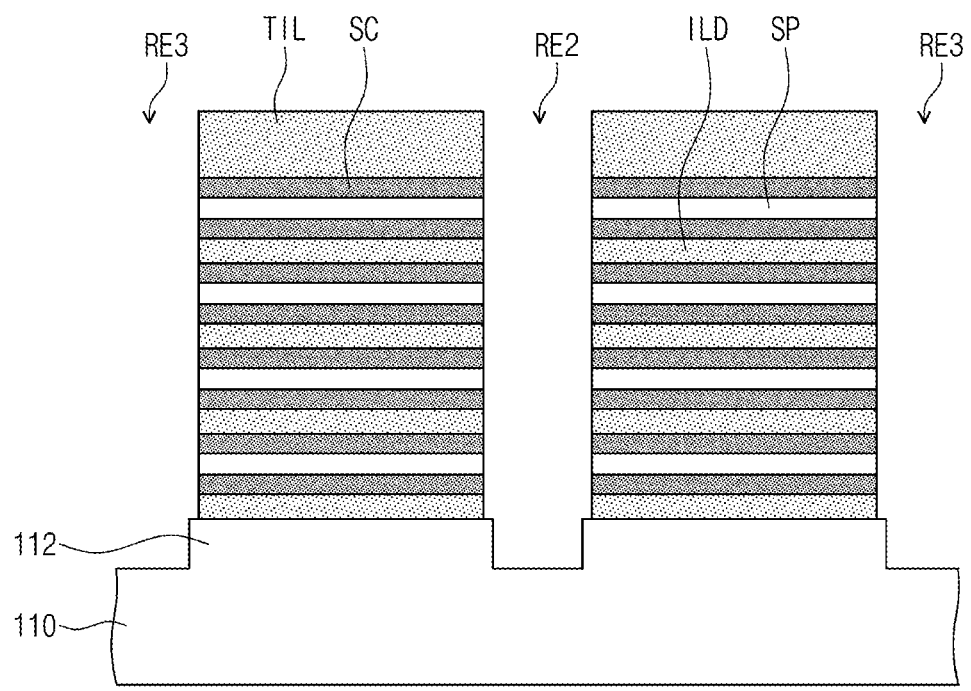

Referring to FIG. 10, portions of the first stack patterns 140 may be removed to form semiconductor patterns SP. For example, top and bottom surfaces of, e.g., each of, the first stack patterns 140 may be partially removed, and the first horizontal regions HR may increase in thickness. Afterwards, sacrificial layers (not shown) may be formed to cover the top and bottom surfaces of the first stack patterns 140, and interlayer dielectric layers (not shown) may be formed to intervene between the sacrificial layers that immediately neighbor each other in the first direction D1.

An etching process may be performed such that the first stack patterns 140, the sacrificial layers, and the interlayer dielectric layers may be divided into semiconductor patterns SP, sacrificial patterns SC, and interlayer dielectric patterns ILD that are spaced apart from each other in the second direction D2. The semiconductor patterns SP, the sacrificial patterns SC, and the interlayer dielectric patterns ILD may each have a shape that extends in the third direction D3 parallel to the top surface of the substrate 110 and intersecting (e.g., orthogonal to) the second direction D2.

Figure 11:
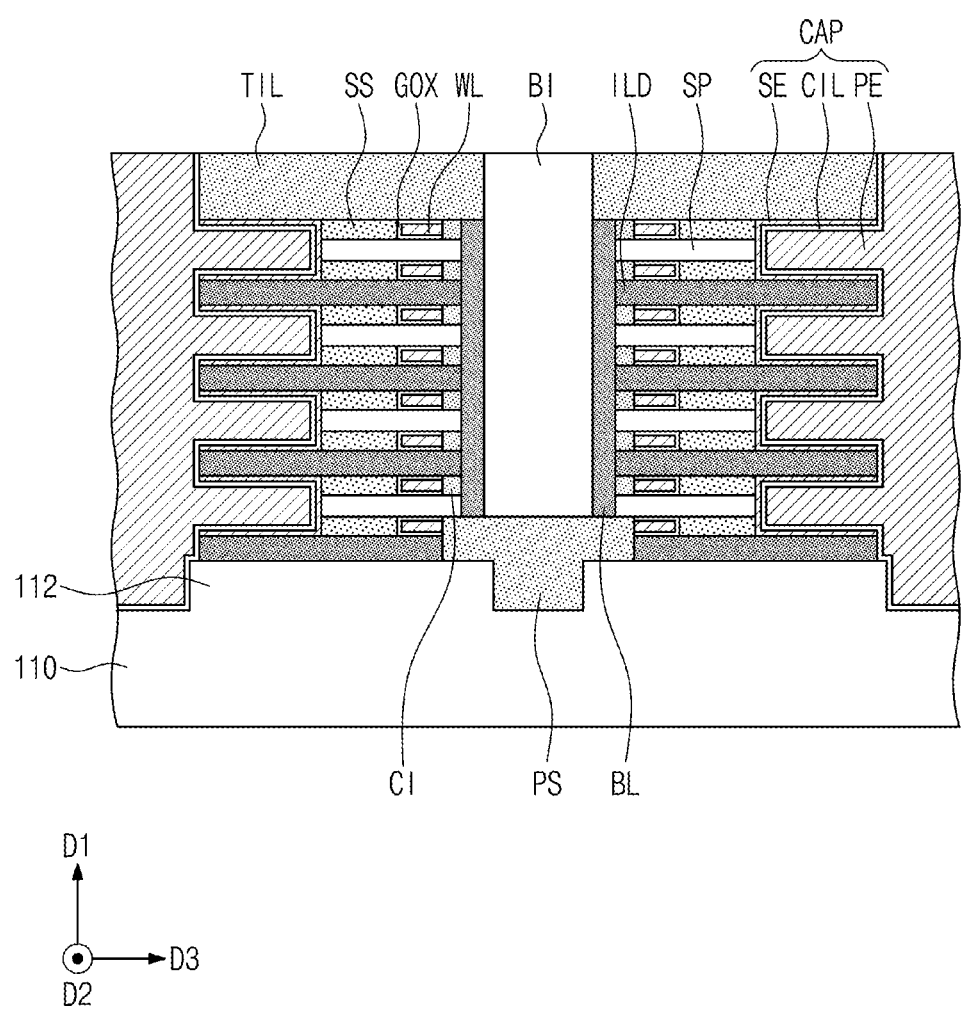

Referring to FIG. 11, an isotropic etching process may be performed such that side portions of the sacrificial patterns SC adjacent to the second recess RE2 may be removed to form second horizontal regions (not shown), and a spacer dielectric pattern SS and a word line WL may be formed in each of the second horizontal regions.

For example, the formation of the spacer dielectric pattern SS may include depositing a dielectric layer that fills the second horizontal region, and performing an etching process to etch a portion of the dielectric layer adjacent to the second recess RE2. After the etching process, a remaining portion of the dielectric layer may constitute the spacer dielectric pattern SS.

The formation of the word line WL may include forming a gate dielectric layer GOX that conformally covers an inner wall of the second horizontal region, forming a word-line layer (not shown) that fills an unoccupied portion of the second horizontal region and extends in the first direction D1 along a lateral surface of the semiconductor pattern SP, and etching the word-line layer on the lateral surface of the semiconductor pattern SP to form a plurality of word lines WL that are separated from each other.

The word line WL may run across the semiconductor pattern SP. For example, the semiconductor pattern SP may have a shape that extends in the third direction D3, and the word line WL may have a shape that extends in the second direction D2. The word lines WL may include a conductive material.

A portion of the second horizontal region may be formed again in the etching process of the word-line layer. A capping dielectric pattern CI may be formed to fill the unoccupied portion of the second horizontal region, and a lower protection pattern PS may be formed on the top surface of the substrate 110 in the second recess RE2. The formation of the capping dielectric pattern CI and the lower protection pattern PS may include forming a capping dielectric layer that fills the second recess RE2 and the portion of the second horizontal region, and removing a portion of the capping dielectric layer in the second recess RE2. The capping dielectric pattern CI and the lower protection pattern PS may include silicon nitride.

A bit line BL may be connected to one end, e.g., a first end, of the semiconductor pattern SP. The semiconductor pattern SP may have a certain end adjacent to the word line WL, and the certain end may be the one end of the semiconductor pattern SP. The bit line BL may intersect the semiconductor pattern SP and the word line WL. For example, the word line WL and the semiconductor pattern SP may each have a shape that extends in the second direction D2 and the third direction D3, and the bit line BL may have a shape that extends in the first direction D1. The bit line BL may extend along the first direction D1, and may be connected to ends of a plurality of semiconductor patterns SP.

A buried dielectric pattern BI may be formed to fill an unoccupied portion of the second recess RE2. The buried dielectric pattern BI may extend along the first direction D1 from a top surface of the lower protection pattern PS, and may cover a sidewall of the bit line BL.

After that, the third recess RE3 may be used to perform an isotropic etching process, such that remaining portions of the sacrificial patterns SC may be removed to form third horizontal regions (not shown). In the etching process, the spacer dielectric patterns SS may be used as etch stop layers. Portions of the semiconductor patterns SP may also be etched to reduce a thickness in the third direction D3 of each of the semiconductor patterns SP.

Storage electrodes SE may be locally formed in the third horizontal regions. Each of the storage electrodes SE may cover an inner wall of the third horizontal region and may be in contact with another end, e.g., a second end, of the semiconductor pattern SP, i.e., an end that is not in contact with the bit line BL. For example, the storage electrode SE may have a hollow cylindrical shape. For another example, the storage electrode SE may have a pillar shape having a major axis in the third direction D3. The storage electrode SE may include at least of metal, metal nitride, and metal silicide.

Before the formation of the storage electrodes SE, portions of the semiconductor patterns SP may be doped with impurities to form source/drain regions, and the storage electrodes SE may be in contact with the source/drain regions.

Thereafter, a capacitor dielectric layer CIL may be formed to conformally cover the third horizontal regions in which the storage electrodes SE are formed, and a plate electrode PE may be formed to fill the third recess RE3 and the third horizontal regions in which the storage electrodes SE and the capacitor dielectric layer CIL are formed. A capacitor CAP may be constituted by the storage electrodes SE, the capacitor dielectric layer CIL, and the plate electrode PE. The capacitor CAP may be connected to the other end of the semiconductor pattern SP, i.e., the end that is not in contact with the bit line BL.

Figure 12:
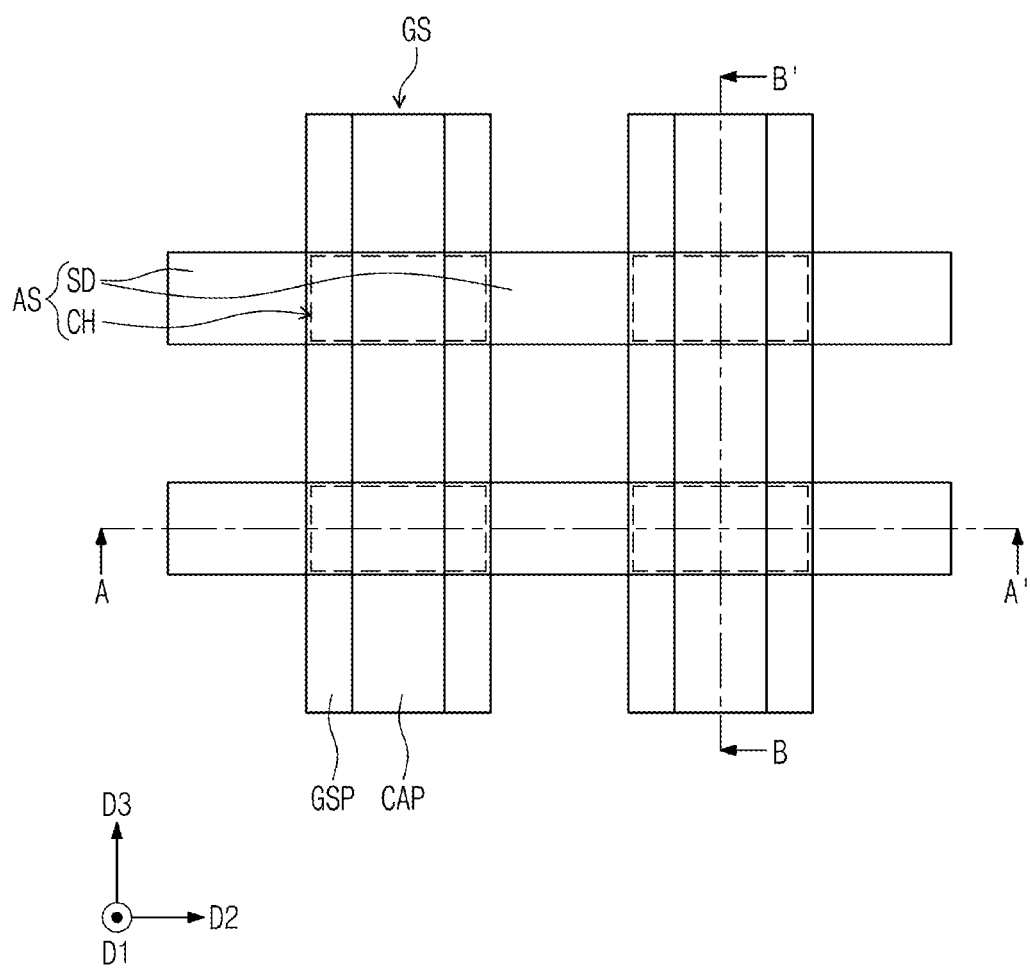
FIG. 12 illustrates a plan view of a semiconductor device fabricated by using the pattern formation method of FIGS. 1 to 6.

FIG. 12 illustrates a plan view showing a semiconductor device fabricated by using the pattern formation method of FIGS. 1 to 6. FIGS. 13 to 16 illustrate cross-sectional views taken along lines A-A' and B-B' of FIG. 11, showing a semiconductor device fabrication method using the pattern formation method of FIGS. 1 to 6. With reference to FIGS. 12 to 16, the following will describe a semiconductor device fabrication method using the pattern formation method discussed with reference to FIGS. 1 to 6. A duplicate explanation will be omitted for brevity of description.

Figure 13:
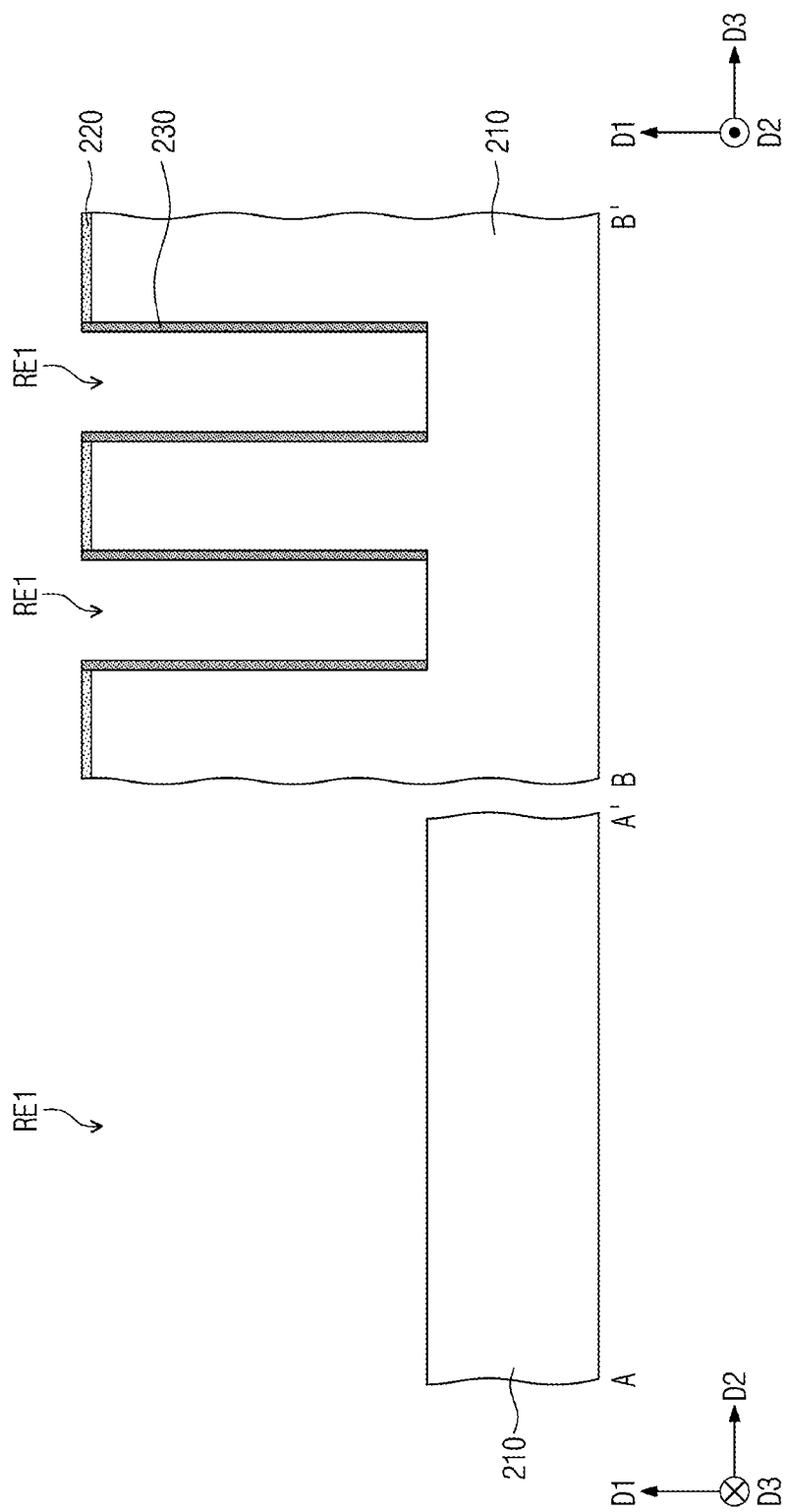
FIGS. 13 to 16 illustrate cross-sectional views taken along lines A-A' and B-B' of FIG. 11, showing a semiconductor device fabrication method using the pattern formation method of FIGS. 1 to 6.

Referring to FIGS. 12 and 13, a first capping pattern 220 and the first recesses RE1 may be formed on a substrate 210. The formation of the first capping pattern 220 and the first recesses RE1 may include forming a first capping layer on the substrate 210, and removing a portion of the first capping layer and an upper portion of the substrate 210 to form the first recesses RE1 that penetrate the first capping layer and the upper portion of the substrate 210. A non-removed portion of the first capping layer may constitute the first capping pattern 220. The first recesses RE1 may penetrate the upper portion of the substrate 210 along the first direction D1 perpendicular to a top surface of the substrate 210. When viewed in plan, the first recesses RE1 may each have a linear shape that extends along the second direction D2 parallel to the top surface of the substrate 210, and may be spaced apart from each other along the third direction D3 that is parallel to the top surface of the substrate 210 and intersects (e.g., is orthogonal to) the second direction D2.

The first capping pattern 220 may include a material having a high etch selectivity with respect to the substrate 210. For example, the substrate 210 may be a silicon substrate, and the first capping pattern 220 may include a material having a high etch selectivity with respect to the silicon substrate, e.g., silicon oxide.

A second capping pattern 230 may be formed to cover an inner sidewall of each of the first recesses RE1. For example, a second capping layer may be formed to cover the inner sidewall and a bottom surface of each of the first recesses RE1 and to extend onto a top surface of the first capping pattern 220. The second capping layer may be formed to conformally cover the inner sidewall of the first recess RE1, the bottom surface of the first recess RE1, and the top surface of the first capping pattern 220.

Afterwards, the second capping layer may be removed from the top surface of the first capping pattern 220 and from the bottom surface of the first recess RE1. A non-removed portion of the second capping layer may remain on the inner sidewall of the first recess RE1, and may constitute the second capping pattern 230. As the second capping layer is removed from the bottom surface of the first recess RE1, a surface of the substrate 210 may be partially outwardly exposed on the bottom surface of the first recess RE1.

The second capping pattern 230 may include a material having a high etch selectivity with respect to the first capping pattern 220. For example, the first capping pattern 220 may include silicon oxide, and the second capping pattern 230 may include a material having a high etch selectivity with respect to the silicon oxide, e.g., silicon nitride.

Figure 14:
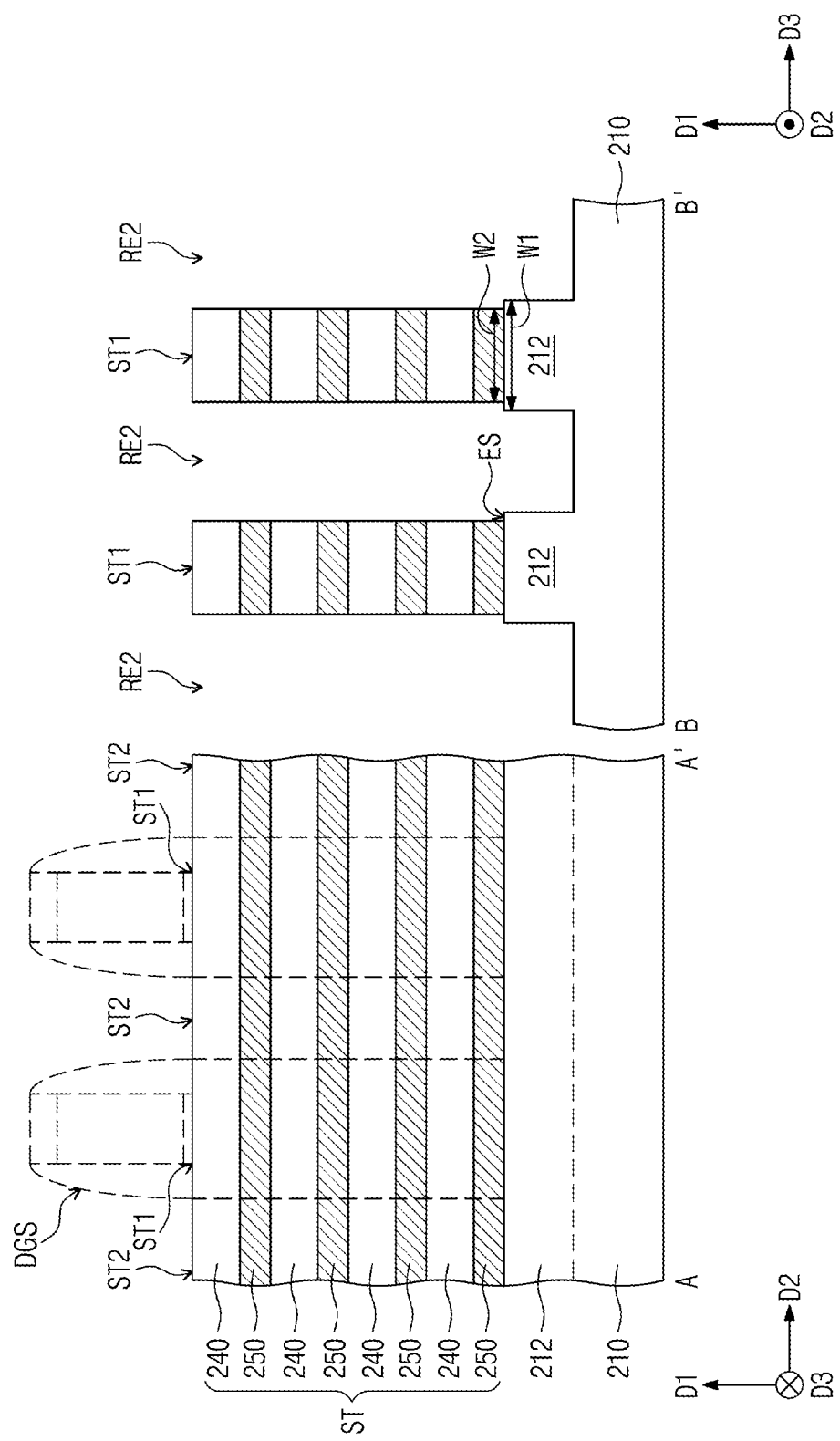

Referring to FIGS. 12 and 14, a stack structures ST may be formed in each of the first recesses RE1. The stack structure ST may include first stack patterns 240 and second stack patterns 250 that are alternately stacked. The stack structure ST may have a linear shape that extends along the second direction D2, and may be spaced apart in the third direction D3 from a neighboring stack structure ST.

The formation of the stack structure ST may include alternately epitaxially growing the first stack patterns 240 and the second stack patterns 250. For example, the second stack pattern 250 may be epitaxially grown from a seed or a surface of the substrate 210 exposed on the bottom surface of the first recess RE1, and the first stack pattern 240 may be epitaxially grown from the second stack pattern 250 that serves as a seed. Afterwards, an epitaxial growth of a new second stack pattern 250 and a new first stack pattern 240 may be repeatedly performed.

After the formation of the stack structure ST, the first capping pattern 220, the second capping pattern 230, and a portion of the substrate 210 may be removed. The partial removal of the substrate 210 may form a protrusion 212 of the substrate 210. The protrusion 212 may have at its upper portion a width W1 in the third direction D3 greater than a width W2 in the third direction D3 at a lower portion of the stack structure ST. The protrusion 212 may have, at its top surface, an exposed surface ES exposed by the stack structure ST. A stepwise profile may be constituted by a lateral surface of the stack structure ST, the exposed surface ES of the protrusion 212, and a lateral surface of the protrusion 212. The protrusion 212 may have a linear shape that extends in the second direction D2 under and along the stack structure ST, and may be spaced apart in the third direction D3 from a neighboring protrusion 212.

The removal procedure mentioned above may form the second recess RE2 between neighboring stack structures ST. The second recess RE2 may expose lateral surfaces of the stack structures ST. For example, the second recess RE2 may expose lateral surfaces of the first stack patterns 240 of the stack structures ST, and may also expose lateral surfaces of the second stack patterns 250 of the stack structures ST.

The stack structure ST may include a first part ST1 and a second part ST2. The first part ST1 may be a region of the stack structure ST that vertically overlaps a dummy gate structure DGS (designated by a dotted line) that is to be formed subsequently, and the second part ST2 may be another portion of the stack structure ST. The second part ST2 may be a section interposed between neighboring first parts ST1. The first part ST1 and the second part ST2 may be provided alternately along the second direction D2.

Figure 15:
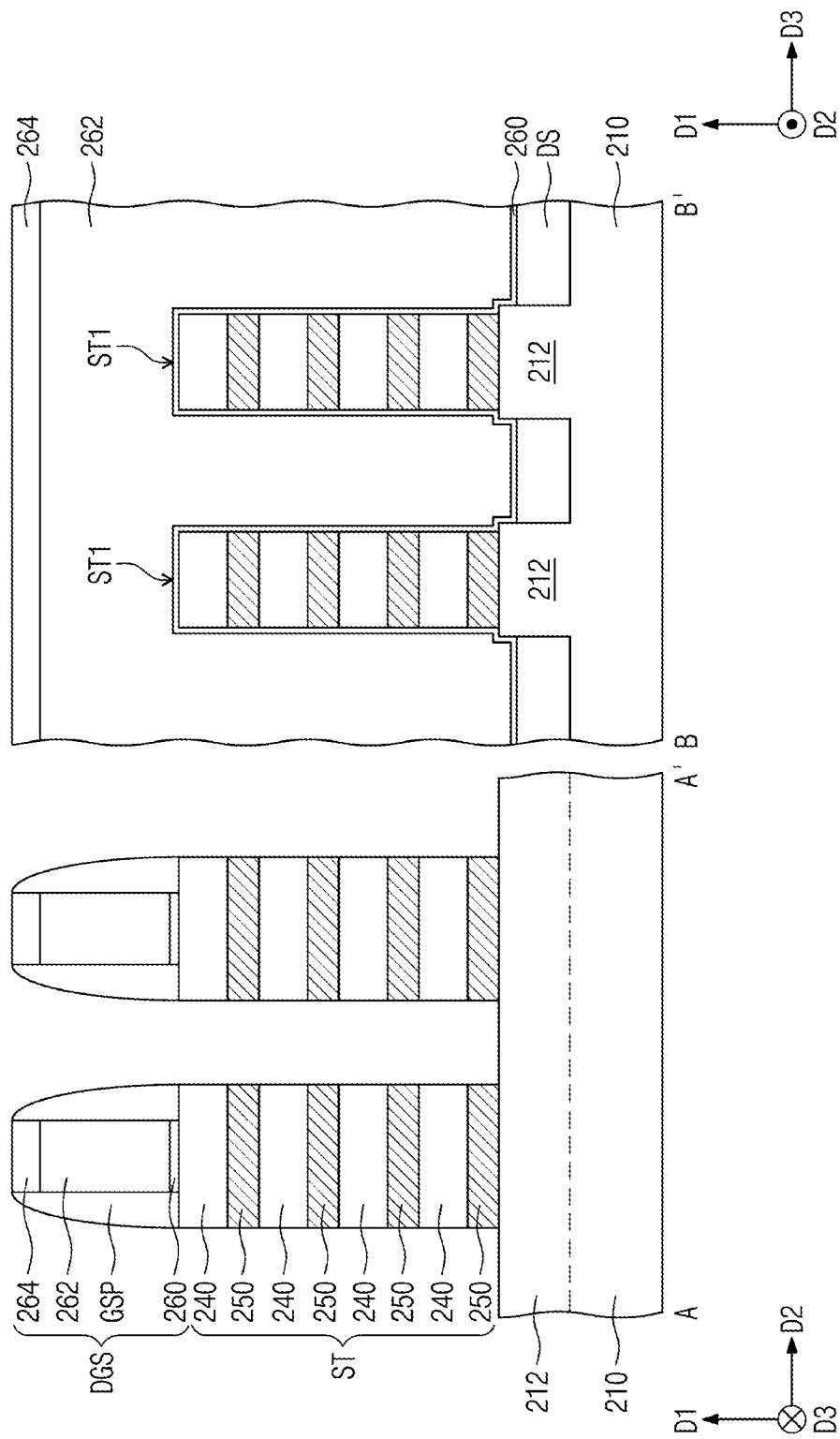

Referring to FIGS. 12 and 15, device isolation patterns DS may be formed between the protrusions 212. Each of the device isolation patterns DS may fill a lower portion of the second recess RE2. The device isolation patterns DS may extend in the second direction D2, and may be spaced apart from each other in the third direction D3 across the protrusions 212. The formation of the device isolation patterns DS may include forming on the substrate 210 a dielectric material that fills the second recesses RE2, and removing an upper portion of the dielectric layer until the lateral surfaces of the stack structures ST are completely exposed. The device isolation patterns DS may have their top surfaces at a lower level than that of a top surface of the protrusion 212. The device isolation patterns DS may include one or more of oxide, nitride, and oxynitride.

A dummy gate structure DGS may be formed to run in the third direction D3 across the stack structures ST. The dummy gate structure DGS may have a linear shape that extends in the third direction D3, and may be spaced apart in the second direction D2 from a neighboring dummy gate structure DGS. The dummy gate structure DGS may include an etch stop pattern 260, a sacrificial gate pattern 262, and a mask pattern 264 that are sequentially stacked on the substrate 210, and may further include a pair of gate spacers GSP that cover lateral surfaces of the sacrificial gate pattern 262. The etch stop pattern 260 may lie and extend between the sacrificial gate pattern 262 and the stack structure ST.

The dummy gate structure DGS may be formed to cover the lateral surfaces of the stack structures ST that face each other in the third direction D3, top surfaces of the stack structures ST, and the top surfaces of the device isolation patterns DS. The dummy gate structure DGS may be formed on the first part ST1 of the stack structure ST, and may not be formed on the second part ST2 of the stack structure ST.

Afterwards, the second parts ST2 of the stack structures ST may be removed. The removal of the second parts ST2 may include performing an etching process in which the dummy gate structure DGS is used as an etching mask to etch the second parts ST2. The etching process may be an anisotropic etching process. The first parts ST1 of the stack structures ST may not be removed, and the second parts ST2 of the stack structures ST may be removed, with the result that lateral surfaces of the first parts ST1 may be exposed. The etching process may continue until exposure of the top surface of the substrate 210 below the second parts ST2.

Figure 16:
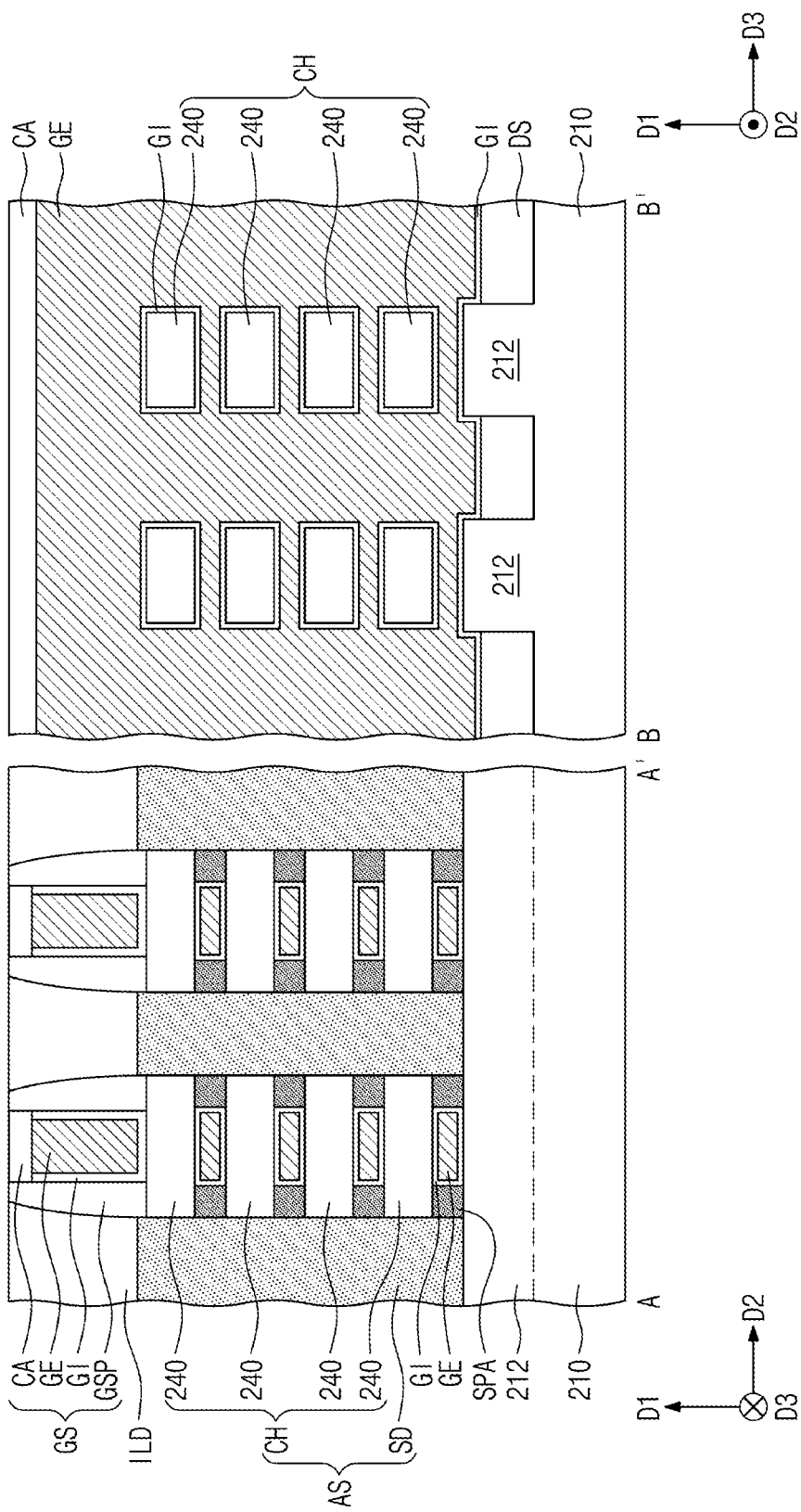

Referring to FIGS. 12 and 16, portions of the second stack patterns 250 may be removed through the exposed lateral surfaces of the first parts ST1. Spacer patterns SPA may be formed in areas where the portions of the second stack patterns 250 are removed. The spacer patterns SPA may be formed such that remaining portions of the second stack patterns 250 may be covered in the second direction D2.

Source/drain patterns SD may be formed on lateral surfaces of the first parts ST1, e.g., the lateral surfaces face each other in the second direction D2. The source/drain patterns SD may be formed by selective epitaxial growth from seeds, or the lateral surfaces of the first parts ST1 and the exposed top surfaces of the substrate 210. The source/drain patterns SD may be electrically connected to the first stack pattern 240.

The source/drain patterns SD may include at least one of silicon-germanium (SiGe), silicon (Si), and silicon carbide (SiC). The formation of the source/drain patterns SD may further include doping impurities into the source/drain patterns SD simultaneously with or after the selective epitaxial growth process. The impurities may be adopted to improve electrical properties of transistors that include the source/drain patterns SD. For example, when the transistors are NMOSFETs, the impurities may include phosphorus (P), and when the transistors are PMOSFETs, the impurities may include boron (B).

An interlayer dielectric pattern ILD may be formed on the substrate 210 on which the source/drain patterns SD are formed. The formation of the interlayer dielectric patterns ILD may include forming on the substrate 210 an interlayer dielectric layer that covers the source/drain patterns SD and the dummy gate structure DGS, and performing a planarization process to planarize the interlayer dielectric layer until the sacrificial gate pattern 262 is exposed. The planarization process may remove the mask pattern 264. The interlayer dielectric pattern ILD may include at least one of a silicon oxide layer, a silicon nitride layer, a silicon oxynitride layer, and a low-k dielectric layer.

The sacrificial gate pattern 262 and the etch stop pattern 260 may be removed, and vertical regions may be formed in areas from which the sacrificial gate pattern 262 and the etch stop pattern 260 are removed. The vertical regions may expose top surfaces of the first parts ST1 and lateral surfaces of the first parts ST1 that face each other in the third direction D3.

An etching process may be performed on the second stack patterns 250 through their exposed lateral surfaces, and horizontal regions may be formed in areas where the second stack patterns 250 are removed. Each of the horizontal regions may be a section defined by the spacer patterns SPA between the first stack patterns 240 that neighbor each other in the first direction D1. The horizontal regions may be spatially connected to the vertical regions.

A gate dielectric pattern GI and a gate electrode GE may be formed to fill the vertical and horizontal regions. The formation of the gate dielectric pattern GI and the gate electrode GE may include forming a gate dielectric layer that conformally covers inner surfaces of the vertical and horizontal regions, forming a gate conductive layer that fills unoccupied portions of the vertical and horizontal regions, and performing a planarization process until the interlayer dielectric pattern ILD is exposed to locally form the gate dielectric pattern GI and the gate electrode GE in the vertical and horizontal regions.

For example, the gate dielectric pattern GI may be formed of at least one of a silicon oxide layer, a silicon nitride layer, a silicon oxynitride layer, and a high-k dielectric layer, and the gate electrode GE may be formed of at least one of doped semiconductor, conductive metal nitride, and metal.

As the gate dielectric pattern GI and the gate electrode GE are formed, the first stack patterns 240 may constitute channel patterns CH. The gate electrode GE may be spaced apart from the channel patterns CH and the protrusion 212 across the gate dielectric pattern GI, and from the source/drain patterns SD across the spacer patterns SPA.

An active structure AS may be constituted by the channel patterns CH and the source/drain patterns SD. When viewed in plan, the active structure AS may extend along the second direction D2, and may be spaced apart in the third direction D3 from a neighboring active structure AS.

The gate dielectric pattern GI and the gate electrode GE may further be formed between a pair of gate spacers GSP. The gate electrode GE may be spaced apart across the gate dielectric pattern GI from each of the pair of gate spacers GSP. A gate capping pattern CA may be formed to lie between the pair of gate spacers GSP and to cover the gate dielectric pattern GI and the gate electrode GE. The gate dielectric pattern GI and the gate electrode GE may be formed to have their top surface located at a level lower than that of top surfaces of the pair of gate spacers GSP, and the gate capping pattern CA may be formed to have a top surface located at a level substantially the same as that of the top surfaces of the pair of gate spacers GSP. A gate structure GS may be defined to include the gate dielectric pattern GI, the gate electrode GE, the gate capping pattern CA, and the pair of gate spacers GSP.

Although not shown, an upper dielectric layer may be formed on the interlayer dielectric pattern ILD. First contact plugs may be formed to penetrate the upper dielectric layer and the interlayer dielectric pattern ILD and to electrically connect to the source/drain patterns SD, and a second contact plug may be formed to penetrate the upper dielectric layer and to electrically connect to the gate electrode GE. Wiring lines may be formed on the upper dielectric layer to be coupled to the first and second contact plugs. The first and second contact plugs and the wiring lines may be formed of a conductive material.

According to example embodiments, in forming a stack structure including a plurality of epitaxial layers, a recess in a substrate may define an area where the stack structure is formed, and an epitaxial growth process may be performed only in the recess. Therefore, no epitaxial growth process may be performed in a remaining region where no stack structure is needed, and as a result, there may be a reduction in time consumption required for the epitaxial growth process and an increase in productivity of products using the stack structure.

In addition, as a second capping pattern covers an inner sidewall of the recess, there may be a limitation imposed on epitaxial growth from a surface of the substrate exposed on the inner sidewall of the recess. Therefore, the epitaxial growth may be performed only on a surface of the substrate exposed on a bottom surface of the recess, and as a result, the stack structure may increase in crystallinity.

By way of summation and review, example embodiments provide a pattern formation method with high productivity. Example embodiments also provide a pattern formation method capable of obtaining an epitaxial pattern whose crystallinity is improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A pattern formation method, comprising:
   forming a first capping layer on a substrate;
   forming a recess that penetrates the first capping layer and an upper portion of the substrate, such that a non-penetrated portion of the first capping layer becomes a first capping pattern;
   forming a second capping pattern that covers an inner sidewall of the recess;
   forming a stack structure in the recess, such that the stack structure includes first stack patterns and second stack patterns that are alternately stacked, and the second capping pattern is between the substrate and a lateral surface of the stack structure; and
   after forming the stack structure, removing the first capping pattern, the second capping pattern, and a portion of the substrate to form a protrusion of the substrate below the stack structure and the second capping pattern.

2. The pattern formation method as claimed in claim 1, wherein a width at an upper portion of the protrusion is greater than a width at a lower portion of the stack structure.

3. The pattern formation method as claimed in claim 1, wherein a combined profile of the lateral surface of the stack structure, a portion of a top surface of the protrusion, and a lateral surface of the protrusion has a stair-shape cross section, the portion of the top surface of the protrusion being exposed by the stack structure.

4. The pattern formation method as claimed in claim 1, wherein forming the stack structure includes using a surface of the substrate as a seed to alternately epitaxially growing the first stack patterns and the second stack patterns, the surface of the substrate being exposed on a bottom surface of the recess.

5. The pattern formation method as claimed in claim 1, wherein at least one of the first stack patterns and the second stack patterns includes silicon.

6. The pattern formation method as claimed in claim 1, wherein at least one of the first stack patterns and the second stack patterns includes silicon and germanium.

7. The pattern formation method as claimed in claim 1, wherein forming the second capping pattern includes:
   forming a second capping layer that covers the inner sidewall and a bottom surface of the recess and extends onto a top surface of the first capping pattern; and
   removing the second capping layer from the top surface of the first capping pattern and from the bottom surface of the recess, such that a portion of the second capping layer on the inner sidewall of the recess becomes the second capping pattern.

8. The pattern formation method as claimed in claim 1, wherein the first capping pattern includes silicon oxide.

9. The pattern formation method as claimed in claim 1, wherein the second capping pattern includes silicon nitride.

10. A semiconductor device fabrication method, comprising:
    forming a first capping layer on a substrate;
    forming a recess that penetrates the first capping layer and an upper portion of the substrate, such that a non-penetrated portion of the first capping layer becomes a first capping pattern;
    forming a second capping pattern that covers an inner sidewall of the recess;
    forming a stack structure including first stack patterns and second stack patterns that are alternately stacked in the recess;
    forming a protrusion of the substrate by removing the first capping pattern, the second capping pattern, and a part of the substrate;
    removing the second stack patterns; forming a semiconductor pattern by removing a portion of each of the first stack patterns;
    forming on the semiconductor pattern a word line that extends across the semiconductor pattern;
    forming a bit line connected to a first end of the semiconductor pattern, the bit line intersecting the word line; and
    forming a capacitor connected to a second end of the semiconductor pattern.

11. The semiconductor device fabrication method as claimed in claim 10, wherein a width at an upper portion of the protrusion is greater than a width at a lower portion of the stack structure.

12. The semiconductor device fabrication method as claimed in claim 10, wherein a combined profile of a lateral surface of the stack structure, a portion of a top surface of the protrusion, and a lateral surface of the protrusion has a stair-shape cross section, the portion of the top surface of the protrusion being exposed by the stack structure.

13. The semiconductor device fabrication method as claimed in claim 10, wherein the first capping pattern includes silicon oxide, and the second capping pattern includes silicon nitride.

14. The semiconductor device fabrication method as claimed in claim 10, wherein forming the second capping pattern includes:

forming a second capping layer that covers the inner sidewall and a bottom surface of the recess and extends onto a top surface of the first capping pattern; and removing the second capping layer from the top surface of the first capping pattern and from the bottom surface of the recess, such that a portion of the second capping layer on the inner sidewall of the recess becomes the second capping pattern.

15. A semiconductor device fabrication method, comprising:

forming a first capping layer on a substrate;

forming a recess that penetrates the first capping layer and an upper portion of the substrate, such that a non-penetrated portion of the first capping layer becomes a first capping pattern;

forming a second capping pattern that covers an inner sidewall of the recess;

forming a stack structure including first stack patterns and second stack patterns that are alternately stacked along a first direction perpendicular to a top surface of the substrate, the stack structure including a first part and a second part that are alternately provided along a second direction parallel to the top surface of the substrate;

forming a protrusion of the substrate by removing the first capping pattern, the second capping pattern, and a portion of the substrate;

removing the second part of the stack structure;

removing the second stack patterns of the first part of the stack structure; and forming a gate structure in a region where the second stack patterns are removed.

16. The semiconductor device fabrication method as claimed in claim 15, wherein a width at an upper portion of the protrusion is greater than a width at a lower portion of the stack structure.

17. The semiconductor device fabrication method as claimed in claim 15, wherein a combined profile of a lateral surface of the stack structure, a portion of a top surface of the protrusion, and a lateral surface of the protrusion has a stair-shape cross section, the portion of the top surface of the protrusion being exposed by the stack structure.

18. The semiconductor device fabrication method as claimed in claim 15, wherein the first capping pattern includes silicon oxide, and the second capping pattern includes silicon nitride.

19. The semiconductor device fabrication method as claimed in claim 15, wherein forming the second capping pattern includes:

forming a second capping layer that covers the inner sidewall and a bottom surface of the recess and extends onto a top surface of the first capping pattern; and removing the second capping layer from the top surface of the first capping pattern and from the bottom surface of the recess, such that the second capping layer on the inner sidewall of the recess becomes the second capping pattern.

* * * * *